(12) United States Patent
Constantino et al.

(10) Patent No.: US 6,556,750 B2
(45) Date of Patent: Apr. 29, 2003

(54) BI-DIRECTIONAL OPTICAL COUPLER

(75) Inventors: John R. Constantino, Livermore, CA (US); Peter A. Perniciaro, Raleigh, NC (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/865,282

(22) Filed: May 25, 2001

(65) Prior Publication Data

US 2002/0031293 A1 Mar. 14, 2002

Related U.S. Application Data

(60) Provisional application No. 60/207,686, filed on May 26, 2000.

(51) Int. Cl.[7] .......................................... H01L 31/0203
(52) U.S. Cl. .............................. 385/41; 385/42; 385/24; 385/31
(58) Field of Search ........................ 385/24, 31, 39–42; 250/551

(56) References Cited

U.S. PATENT DOCUMENTS 4,271,365 A * 6/1981 Adams ........................ 250/551
5,489,800 A * 2/1996 Brown et al. ................ 257/666
5,514,875 A * 5/1996 Krause ........................ 250/551
5,753,929 A * 5/1998 Bliss ........................... 250/551

OTHER PUBLICATIONS

"Bi–Directional High Speed Optocouplers, Preliminary Technical Data" data sheet from Hewlett Packard's data book, Fall 1996, pp. 1–74 –1–76.

* cited by examiner

Primary Examiner—Akm E. Ullah
Assistant Examiner—Jerry T Rahll
(74) Attorney, Agent, or Firm—Sidley Austin Brown & Wood LLP

(57) ABSTRACT

A bi-directional optical coupler is provided. The bi-directional optical coupler includes a package having a first side and a second side. A forward coupler and a reverse coupler are included in the package. The forward coupler receives DC electric signals at the first side of the package and transmits DC electric signals at the second side of the package. The reverse coupler receives DC electric signals at the second side of the package and transmits DC electric signals at the first side of the package. The inclusion of two couplers within a single package means that the two couplers are subject to the same temperatures and have similar degradation. For this reason, the two couplers remain matched in terms of efficiency.

6 Claims, 3 Drawing Sheets

BI-DIRECTIONAL OPTICAL COUPLER

RELATED APPLICATIONS

This application is a continuation of U.S. Provisional Application Ser. No. 60/207,686 filed May 26, 2000. That disclosure is incorporated in this document by reference.

TECHNICAL FIELD OF THE INVENTION

The present invention relates generally to the use and construction of electrical circuits and electrical circuit components. More particularly, the present invention includes a life and temperature corrected bi-directional optical coupler for transferring signals between circuits.

BACKGROUND OF THE INVENTION

Optical couplers, also referred to as optocouplers are a widely used method for interconnecting different circuits. They are particularly useful when signals need to be transferred between circuits that do not (or cannot) share a common ground. Optocouplers are also useful where DC voltage level translations are required.

As an example, consider the circuit of FIG. 1. In this circuit, a microcontroller is used to control the operation of an electric motor. The electrical output of the microcontroller is insufficient to directly drive the motor. For this reason, a motor controller is positioned between the microcontroller and the electric motor. The microcontroller sends a low current output signal to the motor controller. This signal, typically encoded using pulse width modulation (PWM) tells the motor controller how fast the motor is to run. The motor controller includes a rectifier or other circuit that translates the low current PWM output of the microcontroller into a current sufficient to drive the electric motor. The microcontroller, motor controller and motor share a single power supply and ground.

In practice, the use of a common ground and power supply tends to make the circuit of FIG. 1 highly susceptible to noise-based faults. This is because noise associated with the motor and motor controller is transmitted directly to the microcontroller. Unfortunately, most microcontrollers tend to be susceptible to noise with the result that the entire circuit tends to be failure prone.

FIG. 2 demonstrates how an optocoupler can be used to overcome some of the limitations just described with regard to FIG. 1. In the circuit of FIG. 2, an optocoupler is inserted between the microcontroller and the motor controller. The microcontroller is also given its own power supply and ground. As a result, noise generated by the motor and motor controller does not feed back into the microcontroller. This greatly reduces noise-based faults of the microcontroller.

The addition of the optocoupler gives the circuit of FIG. 2 much greater reliability. Still, there are circumstances where the addition of an optocoupler can have it's own negative side effects. To illustrate, FIG. 3 shows the circuit of FIG. 2 with the addition of tachometer feedback and an error amplifier. The tachometer feedback signal indicates the actual speed of the electric motor. The error amplifier amplifies the signal output by the motor controller (the desired speed) by the difference between the desired speed and the tachometer feedback signal. The amplification adjusts the electric motor speed so that it matches the desired speed.

Unfortunately, the efficiency of the optocoupler varies both as a function of time and as a function of temperature. This efficiency is know as the current transfer ratio (CTR) and is expressed as the ratio of the collector current to the diode forward current ($I_C/I_F$). CTR typically decreases over time and decreases as temperature increases. These changes ultimately mean undesirable changes in motor speed.

As illustrated by this example, there is a need for an optocoupler that can be used in a way that reduces the changes in CTR associated with time and temperature. This need is particularly apparent for the motor controlling circuit of FIG. 3. It should be appreciated, however, that the drawbacks associated with current optocouplers apply in a general fashion to a wide range of circuits and environments.

SUMMARY OF THE INVENTION

An embodiment of the present invention provides a bi-directional optical coupler. The bi-directional optical coupler includes a package having a first side and a second side. A forward coupler and a reverse coupler are included in the package. The forward coupler receives DC electric signals at the first side of the package and transmits DC electric signals at the second side of the package. The reverse coupler receives DC electric signals at the second side of the package and transmits DC electric signals at the first side of the package.

The two couplers are selected to have closely matched age and performance characteristics. Inclusion of both couplers within a single package means that they age at the same rate (e.g., one cannot be replaced without the other). The inclusion of two couplers within a single package also means that the two couplers are subject to the same temperatures. This means that the performance of the two couplers remains matched as temperatures change during operation.

Stated differently, the present invention includes an integrated circuit that comprises: 1) a package having an inbound side and an outbound side; 2) an forward coupler included within the package, the forward coupler connected to receive DC electric signals at the first side of the package and to retransmit DC electric signals at the second side of the package; and 3) a reverse coupler included within the package, the reverse coupler connected to receive DC electric signals at the second side of the package and to retransmit DC electric signals at the first side of the package.

Other aspects and advantages of the present invention will become apparent from the following descriptions and accompanying drawings.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE PREFERRED EMBODIMENTS

Figure 1:
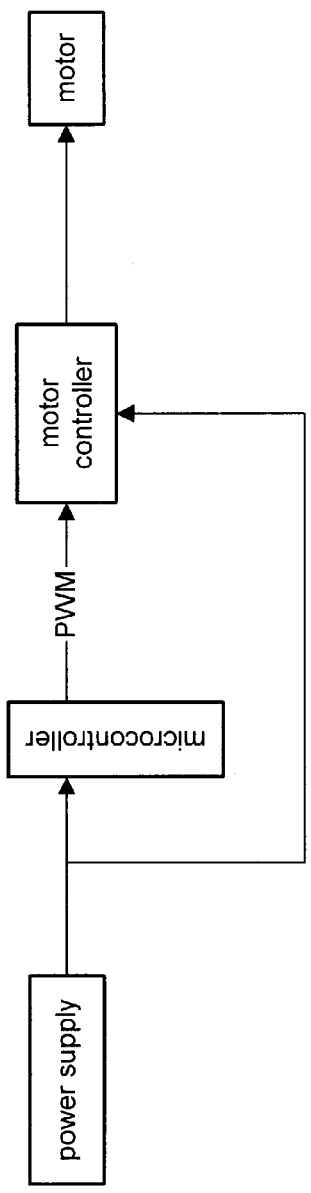
FIG. 1 is a diagram showing a prior art motor control circuit.
Figure 2:
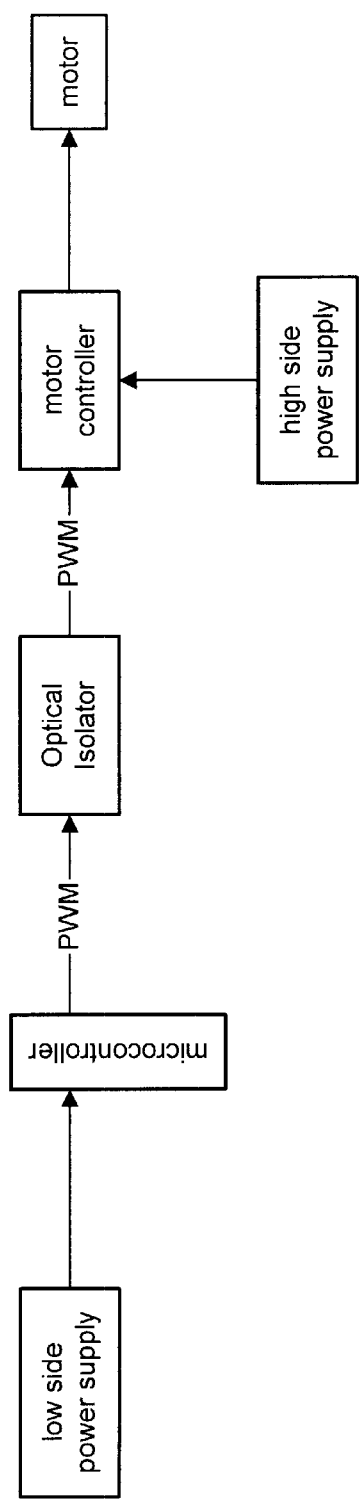
FIG. 2 is a diagram showing the prior art motor control circuit of FIG. 1 with the addition of an optical coupler.
Figure 4:
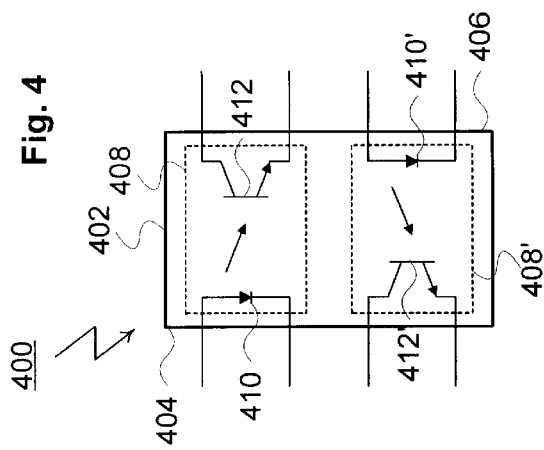
FIG. 4 is a block diagram showing a bi-directional optical coupler according to an embodiment of the present invention.
Figure 6:
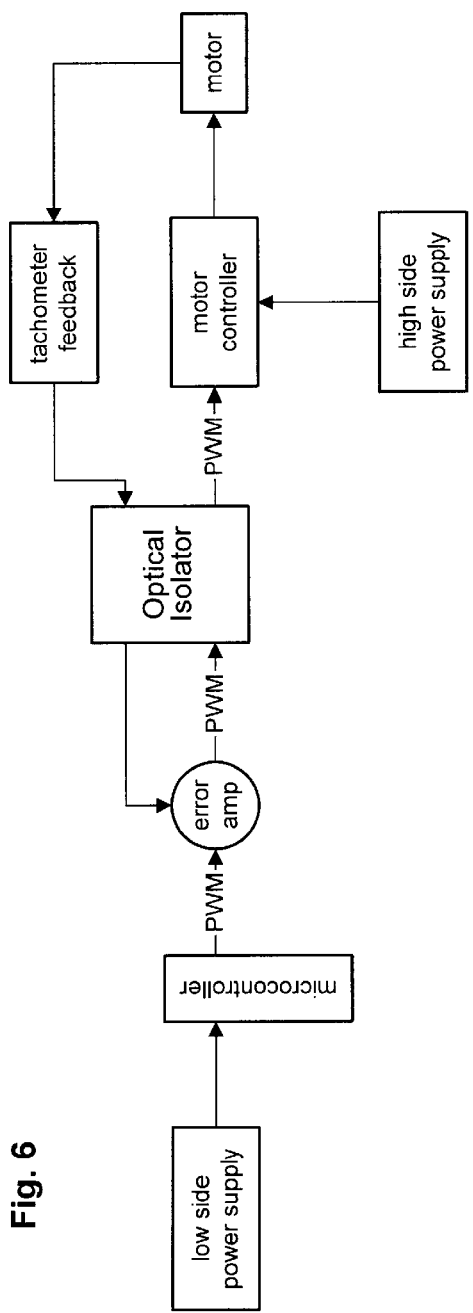
FIG. 6 is a diagram showing the motor control circuit of FIG. 3 modified to use an example of the bi-directional optical coupler of the present invention.
Figure 5:
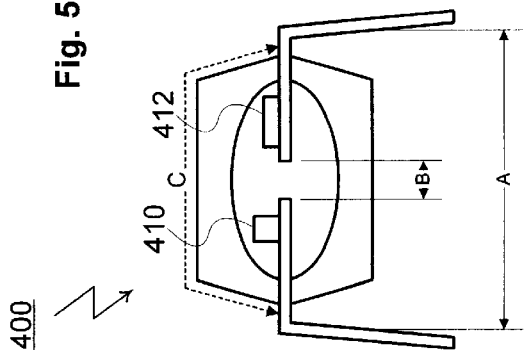
FIG. 5 is a block diagram showing the bi-directional optical coupler configured as a dual inline package (DIP).

The preferred embodiments of the present invention and their advantages are best understood by referring to FIGS. 4 through 6 of the drawings. Like numerals are used for like and corresponding parts of the various drawings.

FIG. 4 shows a bi-directional optical coupler 400 according to an embodiment of the present invention. As shown in FIG. 4, bi-directional optical coupler 400 includes a package 402 having a first side 404 and a second side 406. Package 402 may be fabricated from a range of circuit packaging materials such as epoxy and ceramic materials.

Package 402 surrounds a forward coupler 408. Forward coupler 408 includes a light emitting diode (LED) 410 and a phototransistor 412. LED 410 has two input leads for receiving DC electrical signals. These leads pass through the first side of package 402. Phototransistor 412 has two output leads for transmitting DC electrical signals. These leads pass through the second side of package 402.

LED 410 may be fabricated using a range of differing technologies. Examples of suitable devices for LED 410 include GaAs, AlGaAs, and GaAsP.

Phototransistor 412 is preferably fabricated as a combination of a photo-diode and an amplification stage. Examples of suitable circuitry for the amplification stage include transistors, darlington transistors, triacs, solid-state relays and linear photo-diodes.

LED 410 receives DC electrical signals and converts them to optical radiation. The optical radiation is re-converted to photo current by the photo-diode portion of phototransistor 412. This photo current is injected into the base of the amplification stage and then amplified across the collector-base junction of the amplification stage. This provides amplification for the output of optical coupler 400. In this way, signals received by forward coupler 404 at the first side of package 402 are retransmitted from the second side package 402 without the use of an electrical connection between the first and second sides.

Package 402 also surrounds a reverse coupler 408'. Reverse coupler 408' is, in effect, a mirrored copy of forward coupler 408. Thus, reverse coupler 408' includes a light emitting diode (LED) 410' and a phototransistor 412'. LED 410' has two input leads for receiving DC electrical signals. These leads pass through the second side of package 402. Phototransistor 412' has two output leads for transmitting DC electrical signals. These leads pass through the first side of package 402. LED 410' and phototransistor 412' will typically (but not necessarily) be fabricated using the same technologies as LED 410 and phototransistor 412'.

Reverse coupler 408' may be described as a mirrored copy of forward coupler 408 because it performs the same function (typically, but not necessarily using the same components) but is reversed in orientation. Thus reverse coupler 408' receives signals at the second side of package 402 and forwards to the first. Forward coupler 408 receives signals at the first side of package 402 and forwards to the second. It should be appreciated that there will be some implementations of the present invention where reverse coupler 408' will not be physically mirrored or reversed. This could be the case, for example, where reverse coupler 408' is oriented like forward coupler 408 with the leads for where reverse coupler 408' routed to emerge at the second and first sides of package 402, respectively.

Figure 3:
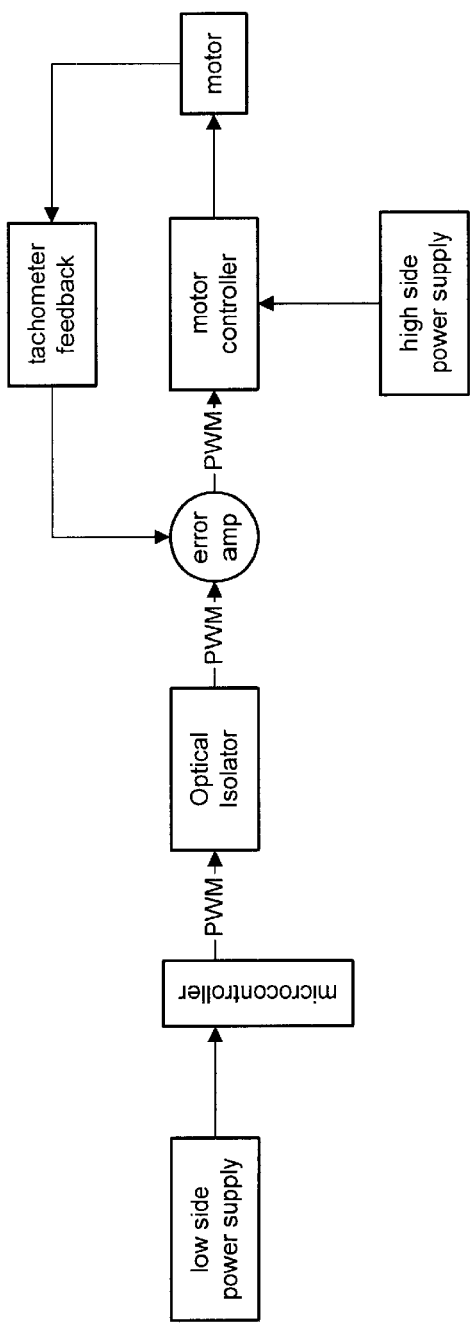
FIG. 3 is a diagram showing the prior art motor control circuit of FIG. 2 with the addition of an error amplifier.

The reverse orientation of reverse coupler 408' gives optical coupler 400 its bi-directional nature. This is better appreciated, perhaps by reference to FIG. 5. FIG. 5 shows the circuit of FIG. 3 modified to use an example of bi-directional optical coupler 400. For this circuit, the error amplifier is placed upstream of its former location to be between the microcontroller and optical coupler 400. Both the PWM signal of the microcontroller and the tachometer signal are routed though optical coupler 400. Thus, optical coupler 400 is used both to send and to receive signals.

Forward coupler 408 and reverse coupler 408' are preferably selected to have closely matched age and performance characteristics. In many cases, this can be accomplished by ensuring that selecting forward coupler 408 and reverse coupler 408' are selected from the same production batch. This can be accomplished, for example by selecting forward coupler 408 and reverse coupler 408' from proximal or adjacent locations on the same semi-conductor die.

For some applications, optical coupler 400 is configured to support applications where high isolation voltage is required. One such application is use in European 240V (AC) mains. This application requires an isolation voltage of 3 kV (RMS) minimum to meet safety agency requirements. To provide high isolation voltage, optical coupler 400 uses a dual-in-line (DIP) configuration for package 402. An example of the DIP configuration is shown in FIG. 5. As shown, the input and output pins of optical coupler 400 are separated by a distance A. Internally, a distance B separates the lead frame attached to LED 410 and the lead frame attached to phototransistor 412. The shape of package 402 also creates an external creepage distance C. Distances A, B and C are variable to create different isolation voltages for optical coupler 400. To meet European safety agency requirements, optical coupler 400 is manufactured so that distance A exceeds 8 mm, distance B exceeds 1 mm and distance C exceeds 8 mm.

The DIP package may be produced with a special wide lead spacing (distance A) of 10 mm typical, thus meeting safety agency requirements of >8 mm clearance distance across the isolation barrier for reinforced insulation. Reinforced insulation is required for certain applications such as office machines and electrical household goods where hazardous voltages are interfaced to touchable safe extra low voltage (SELV) circuits. Optical coupler 400 combines the bi-directional feature with a package suitable for reinforced insulation applications.

The use of bi-directional optical coupler 400 gives the circuit of FIG. 6 greater stability than the circuit of FIG. 4. In particular, it is important to note that changes to the current transfer ratio (CTR) of bi-directional optical coupler 400 will apply equally to the PWM signal and the tachometer signal. As a result, the circuit of FIG. 6 is at least somewhat self-compensating for changes in CTR caused by temperature and time.

Figure 7:
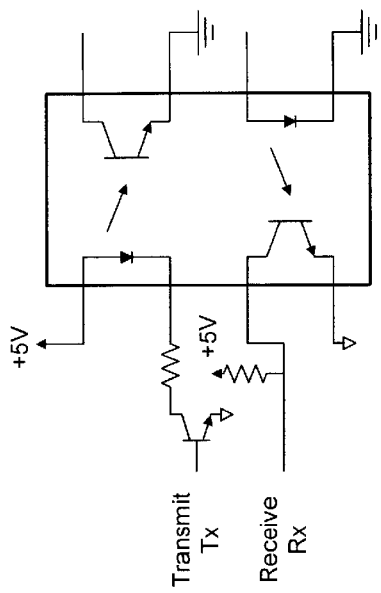
FIG. 7 is a diagram showing the details of use of the bi-directional optical coupler of the present invention.

FIG. 7 shows bi-directional optical coupler 400 configured to transmit and receive signals (i.e., as would be appropriate for the circuit of FIG. 6).

Although particular embodiments of the present invention have been shown and described, it will be apparent to those skilled in the art that changes and modifications may be made without departing from the present invention in its broader aspects, and therefore, the appended claims are to encompass within their scope all such changes and modifications that fall within the true scope of the present invention.

What is claimed is:

1. An integrated circuit that comprises:

a package having a first side and a second side;

a forward coupler included within the package, the forward coupler connected to receive DC electric signals at the first side of the package and to retransmit DC electric signals at the second side of the package; and a reverse coupler included within the package, the reverse coupler connected to receive DC electric signals at the second side of the package and to retransmit DC electric signals at the first side of the package;

wherein the forward and reverse couplers each further comprise:

a light emitting diode for converting an DC electric signal to optical radiation; and a phototransistor for reconverting the optical radiation to a DC electric signal wherein the light emitting diodes in the forward and reverse couplers are each positioned to be adjacent to the first side of the package.

2. An integrated circuit as recited in claim 1 having an isolation voltage of greater than 3 kV.

3. An integrated circuit as recited in claim 1 wherein the package is configured as a dual inline package.

4. An integrated circuit as recited in claim 1 further comprising a first set of conductors connected to the forward coupler; and a second set of conductors connected to the reverse coupler;

wherein the shortest distance through air between first and second sets of conductors is at least 8 mm and the shortest distance between first and second sets of conductors is at least 1 mm;

whereby an isolation voltage of greater than 3 kV is provided.

5. An integrated circuit that comprises:

a package having a first side and a second side;

a forward coupler included within the package, the forward coupler connected to receive DC electric signals at the first side of the package and to retransmit DC electric signals at the second side of the package; and a reverse coupler included within the package, the reverse coupler connected to receive DC electric signals at the second side of the package and to retransmit DC electric signals at the first side of the package;

wherein the forward and reverse couplers each further comprise:

a light emitting diode for converting an DC electric signal to optical radiation; and a phototransistor for reconverting the optical radiation to a DC electric signal;

and further comprising a first set of conductors connected to the forward coupler; and a second set of conductors connected to the reverse coupler;

wherein the shortest distance through air between first and second sets of conductors is at least 8 mm and the shortest distance between first and second sets of conductors is at least 1 mm;

whereby an isolation voltage of greater than 3 kV is provided.

6. An integrated circuit as recited in claim 5 wherein the package is configured as a dual inline package.

* * * * *